(12) United States Patent
Kim et al.

(10) Patent No.: US 12,538,838 B2
(45) Date of Patent: Jan. 27, 2026

(54) LIGHT EMITTING DIODE CHIP AND DISPLAY APPARATUS INCLUDING THE SAME

(71) Applicant: SAMSUNG ELECTRONICS CO., LTD., Suwon-si (KR)

(72) Inventors: Sungyeol Kim, Suwon-si (KR); Kyungsoo Park, Suwon-si (KR); Chunsoon Park, Suwon-si (KR); Kyehoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 619 days.

(21) Appl. No.: 17/698,637

(22) Filed: Mar. 18, 2022

(65) Prior Publication Data

US 2022/0208742 A1 Jun. 30, 2022

Related U.S. Application Data

(63) Continuation of application No. PCT/KR2021/002165, filed on Feb. 22, 2021.

(30) Foreign Application Priority Data

Dec. 3, 2020 (KR) .................. 10-2020-0167686
Jan. 12, 2021 (KR) .................. 10-2021-0004041

(51) Int. Cl.
*H01L 25/075* (2006.01)
*H01L 33/10* (2010.01)
(Continued)

(52) U.S. Cl.
CPC ....... *H01L 25/0753* (2013.01); *H10H 20/814* (2025.01); *H10H 20/8506* (2025.01)

(58) Field of Classification Search
CPC ..... H01L 33/00–648; H01L 27/15–156; H01L 2933/00–0091; H01L 25/0753;
(Continued)

(56) References Cited

U.S. PATENT DOCUMENTS 6,940,099 B2 9/2005 Hata et al.
8,609,448 B2 12/2013 Chen et al.
(Continued)

FOREIGN PATENT DOCUMENTS

JP 2004-276383 A 10/2004
JP 2016-72524 A 5/2016
(Continued)

OTHER PUBLICATIONS

Communication dated Aug. 30, 2021, issued by the International Searching Authority in counterpart International Application No. PCT/KR2021/002165 (PCT/ISA/210).

*Primary Examiner* — Cuong B Nguyen
(74) *Attorney, Agent, or Firm* — Sughrue Mion, PLLC

(57) ABSTRACT

A display apparatus is provided. The display apparatus includes a printed circuit board (PCB), a light emitting diode (LED) chip provided on the PCB and configured to output light, an optical dome provided on the LED chip and the LED chip, a void formed by air inside the optical dome and between the LED chip and the PCB, and an air barrier provided between the LED chip and the PCB such that the void is spaced apart from the LED chip.

16 Claims, 18 Drawing Sheets

(51) Int. Cl.
    *H01L 33/48*      (2010.01)
    *H10H 20/814*     (2025.01)
    *H10H 20/85*      (2025.01)

(58) Field of Classification Search
    CPC .......... H01L 25/167; H10H 20/00–882; H10H 29/00–142; H10H 29/30–962; H10H 20/814; H10H 20/8506; H10H 20/857; H10H 20/841; H10H 20/85; H10D 30/0295; H10D 30/509; H10D 86/0227
    See application file for complete search history.

(56)            References Cited

U.S. PATENT DOCUMENTS

| | | | |
|---|---|---|---|
| 9,876,149 | B2 | 1/2018 | Bang et al. |
| 10,347,803 | B2 | 7/2019 | Lee et al. |
| 2010/0290233 | A1 | 11/2010 | Okazaki |
| 2011/0062470 | A1* | 3/2011 | Bierhuizen ............ H01L 33/60 257/E33.001 |
| 2016/0133804 | A1 | 5/2016 | Lee et al. |
| 2019/0364669 | A1* | 11/2019 | Matsuo ................ H05K 3/3494 |
| 2020/0403133 | A1* | 12/2020 | Yoo ..................... H05K 3/0061 |
| 2021/0119087 | A1* | 4/2021 | Kim ................. G02F 1/133603 |

FOREIGN PATENT DOCUMENTS

| | | |
|---|---|---|
| KR | 10-2012-0107271 A | 10/2012 |
| KR | 10-2015-0098350 A | 8/2015 |
| KR | 10-2015-0138605 A | 12/2015 |
| KR | 10-2016-0055417 A | 5/2016 |
| KR | 10-2016-0137041 A | 11/2016 |

* cited by examiner

LIGHT EMITTING DIODE CHIP AND DISPLAY APPARATUS INCLUDING THE SAME

CROSS-REFERENCE TO RELATED APPLICATION(S)

This application is a by-pass continuation of International Application No. PCT/KR2021/002165, filed on Feb. 22, 2021, in the Korean Intellectual Property Receiving Office, which is based on and claims priority to Korean Patent Application No. 10-2021-0004041, filed on Jan. 12, 2021, in the Korean Intellectual Property Office, and Korean Patent Application No. 10-2020-0167686, filed on Dec. 3, 2020, in the Korean Intellectual Property Office, the disclosures of which are incorporated by reference herein in their entireties.

BACKGROUND

1. Field

The disclosure relates to a light emitting diode (LED) chip having an improved light uniformity and a display apparatus including the same.

2. Description of Related Art

A display apparatus is an output device that may visually display data information, such as text or figures, and an image, and includes a television, various monitors, and various portable terminals (e.g., notebook computers, tablet personal computers (PCs), and smart phones).

The display apparatus may be classified into an emissive type display apparatus that uses a display panel that emits light by itself, such as an organic light emitting diode (OLED), and a non-emission type display apparatus that does not emit light by itself, such as a liquid crystal display (LCD) and needs to be supplied with light from a backlight unit.

The backlight unit may be classified into a direct type backlight unit in which a light source is disposed at a rear of a display panel and an edge type backlight unit in which a light source is disposed at a side of a display panel according to the position of the light source. The direct type backlight unit may include a light source plate in which a light emitting diode (LED) is mounted on a printed circuit board having a flat shape.

In a display apparatus including a backlight unit, light uniformity of a light source is very important. Because when the light emitted from the light source is not uniform, the luminance of an image displayed by the display apparatus is not uniform.

SUMMARY

Provided are an LED chip having an improved light uniformity by changing the position of a void formed inside an optical dome, and a display apparatus including the same.

Additional aspects will be set forth in part in the description which follows and, in part, will be apparent from the description, or may be learned by practice of the presented embodiments.

In accordance with an aspect of the disclosure, a display apparatus may include a printed circuit board (PCB), a light emitting diode (LED) chip provided on the PCB and configured to output light, an optical dome provided on the LED chip and covering the LED chip, a void formed by air inside the optical dome and between the LED chip and the PCB, and an air bather provided between the LED chip and the PCB such that the void is spaced apart from the LED chip.

The display apparatus may further comprise a solder paste provided between the LED chip and the PCB, where the air barrier may be formed by reflowing the solder paste.

The air barrier may be configured to prevent or delay air between the LED chip and the PCB from being discharged into the optical dome.

The display apparatus may further comprise a solder paste provided on the PCB, where the solder paste may include solder powder and a flux.

The air barrier may comprise the flux.

The LED chip may comprise a first electrode pad and a second electrode pad provided in parallel with each other in a first direction, and the air barrier may extend in the first direction.

The air barrier may comprise a first air barrier and a second air barrier spaced apart from each other in a second direction perpendicular to the first direction.

The void may be spaced apart from the LED chip in the second direction.

The void may be formed on the first air barrier or the second air barrier.

The void may comprise a plurality of voids, and each of the plurality of voids may be formed on the first air barrier or the second air barrier.

A plurality of the voids may be formed on the first air barrier or the second air barrier.

The LED chip may be mounted on a mounting surface of the PCB by a chip on board (COB) method.

The LED chip may have a lateral side and a longitudinal side, a length of which may be less than or equal to 500 μm.

The LED chip may comprise an n-type semiconductor layer, a p-type semiconductor layer, a light emission layer provided between the n-type semiconductor layer and the p-type semiconductor layer, the light emission layer configured to emit light, and a growth substrate configured to cover an upper surface of the n-type semiconductor layer or the p-type semiconductor layer growth.

The LED chip may further comprise a Distributed Bragg reflector (DBR) layer provided on an upper surface of a growth substrate.

According to an aspect of the disclosure, there is provided a display apparatus including a printed circuit board (PCB); a light emitting diode (LED) chip mounted on the PCB and configured to output light; an optical dome formed to surround the LED chip by being dispensed on the LED chip; and an air barrier located between the LED chip and the PCB to prevent or delay air at a lower side of the LED from moving into the optical dome.

The display apparatus may further comprise a solder paste located between the LED chip and the PCB such that the LED chip is mounted on the PCB.

The air barrier may be formed by reflowing the solder paste.

The LED chip may comprise a first electrode pad and a second electrode pad arranged in parallel with each other in a first direction The air barrier may extend in the first direction.

The air barrier may comprise a first air barrier and a second air barrier arranged to be spaced apart from each other in a second direction perpendicular to the first direction.

The solder paste may comprise solder powder and a flux.

The air barrier may comprise the flux.

According to an aspect of the disclosure, an LED chip having an improved light uniformity by changing the position of a void formed inside an optical dome, and a display apparatus including the same can be provided.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

The embodiments set forth herein and illustrated in the configuration of the disclosure are only examples and it would be appreciated by those skilled in the art that changes may be made in the example embodiments without departing from the principles and spirit of the disclosure.

It is to be understood that the singular forms "a," "an," and "the" include plural references unless the context clearly dictates otherwise. In order to make the description of the disclosure clear, unrelated parts are not shown and, the sizes of components are exaggerated for clarity.

It will be further understood that the terms "include", "comprise" and/or "have" when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another.

It is to be understood that the singular forms "a," "an," and "the" include plural references unless the context clearly dictates otherwise Hereinafter, embodiments according to the disclosure will be described in detail with reference to the accompanying drawings.

In the following description, an optical film may include a diffusion plate 130 and optical sheets 140.

Figure 1:
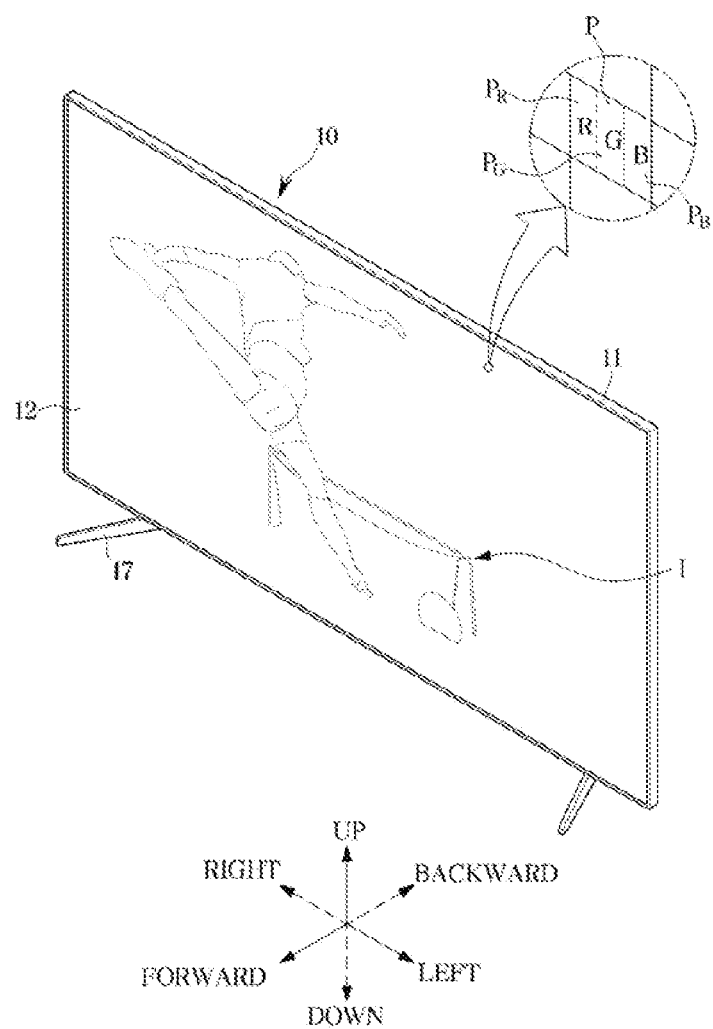
FIG. 1 is a diagram illustrating a display apparatus according to an embodiment.
Figure 2:
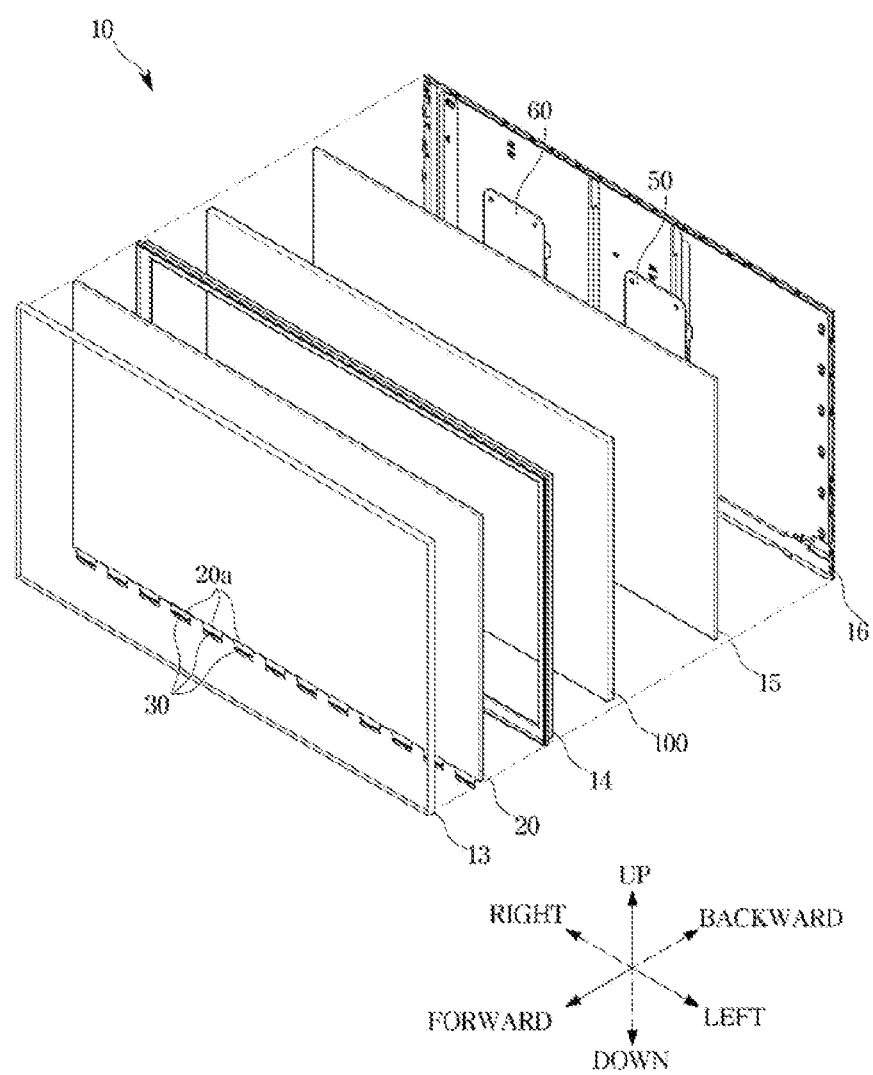
FIG. 2 is diagram illustrating a display apparatus according to an embodiment.
Figure 3:
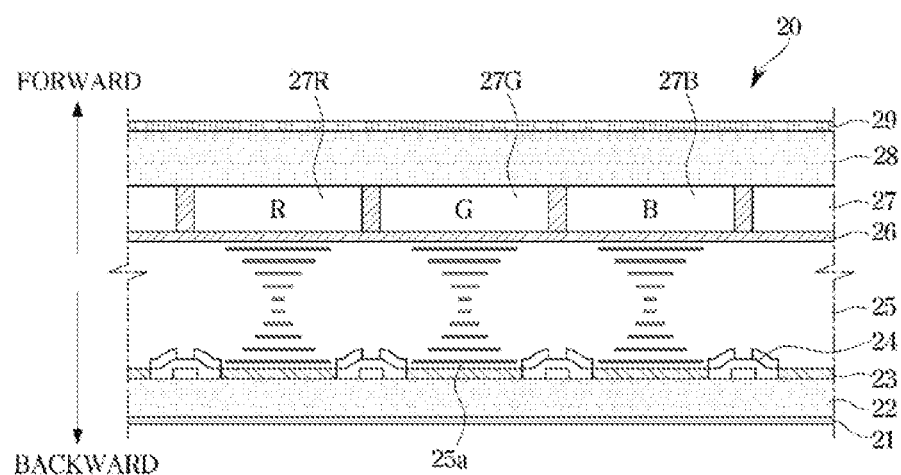
FIG. 3 is a diagram illustrating a liquid crystal panel of a display apparatus according to an embodiment.

FIG. 1 is a diagram illustrating a display apparatus according to an embodiment. FIG. 2 is diagram illustrating a display apparatus according to an embodiment FIG. 3 is a diagram illustrating a liquid crystal panel of a display apparatus according to an embodiment.

Referring to FIG. 1, a display apparatus 10 is a device capable of processing an image signal received from the outside and visually displaying a processed image. The following description will be made in relation that the display apparatus 10 is a television (TV), but the disclosure is not limited thereto. For example, the display apparatus 10 may be implemented in various forms, such as a monitor, a portable multimedia device, a portable communication device, etc., as long as it can visually display an image.

In addition, the display apparatus 10 may be a large format display (LFD) installed outdoors, such as on the roof of a building or at a bus stop, or may be installed in a place where a large number of people enter and exit, such as a subway station, a shopping mall, a movie theater, a company, or a store.

The display apparatus 10 may receive content data including video data and audio data from various content sources, and output video and audio corresponding to the video data and the audio data. For example, the display apparatus 10 may receive content data through a broadcast reception antenna or a wired cable, receive content data from a content reproduction device, or receive content data from a content providing server of a content provider.

As shown in FIG. 1, the display apparatus 10 includes a main body 11, a screen 12 for displaying an image I, and a support 17 provided at a lower side of the main body 11 to support the main body 10.

The main body 11 may form the external appearance of the display apparatus 10, and accommodate parts for the display apparatus 10 to display the image I or perform various functions therein. The main body 11 shown in FIG. 1 has a flat panel shape, but the shape of the main body 11 is not limited to that shown in FIG. 1. For example, the main body 11 may have a curved panel shape.

The screen 12 may be formed on a front surface of the main body 11, and may display the image I. For example, the screen 12 may display a still image or a moving image. In addition, the screen 12 may display a two-dimensional (2D) planar image or a three-dimensional (3D) stereoscopic image using the parallax of the eyes of a user.

The screen 12 may be provided with a plurality of pixels P, and the image I displayed on the screen 12 may be formed by light emitted from each of the plurality of pixels P. For example, light portions emitted by the plurality of pixels P are combined in the form of a mosaic to form the image I on the screen 12.

The plurality of pixels P may emit light of various brightness values and of various colors. For example, each of the plurality of pixels P may include a emissive panel (e.g., a light emitting diode panel) capable of emitting light directly, or a non-emissive panel (e.g., a liquid crystal panel) capable of transmitting or blocking light emitted by a light source device or the like.

In order to emit light of various colors, each of the plurality of pixels P may include sub-pixels $P_R$, $P_G$, and $P_B$.

The sub-pixels $P_R$, $P_G$, and $P_B$ may include a red sub-pixel $P_R$ capable of emitting red light, a green sub-pixel $P_G$ capable of emitting green light, and a blue sub-pixel $P_B$ capable of emitting blue light. For example, red light may represent light having a wavelength of approximately 620 to 750 nm (nanometer, billionths of a meter), green light may represent light having a wavelength of approximately 495 to 570 nm, and blue light may represent light having a wavelength of approximately 450 to 495 nm.

By the combination of red light of the red sub-pixel $P_R$, green light of the green sub-pixel $P_G$, and blue light of the blue sub-pixel $P_B$, each of the plurality of pixels P may emit light of various brightness values and various colors.

As shown in FIG. 2, inside the main body 11, various components for generating the image I on the screen 12 are provided.

For example, inside the main body 11, a light source device 100 that is a surface light source, a liquid crystal panel 20 that transmits or passes light emitted from the light source device 100, a control assembly 50 for controlling the operations of the light source device 100 and the liquid crystal panel 20, and a power assembly 60 for supplying power to the light source device 100 and the liquid crystal panel 20 are provided. In addition, the main body 11 includes a bezel 13, a frame middle mold 14, a bottom chassis 15, and a rear cover 16 that support and fix the liquid crystal panel 20, the light source device 100, the control assembly 50, and the power assembly 60.

The light source device 100 may include a point light source for emitting monochromatic light or white light, and may refract, reflect, and scatter light to convert light emitted from the point light source into uniform surface light. For example, the light source device 100 may include a plurality of light sources for emitting monochromatic light or white light, a diffusion plate for diffusing light introduced from the plurality of light sources, a reflective sheet for reflecting light directed from the plurality of light sources and a rear surface of the diffusion plate, and an optical sheet for refracting and scattering light directed from the front surface of the diffusion plate.

As described above, the light source device 100 may refract, reflect, and scatter light emitted from the light source to emit uniform surface light toward the front.

The configuration of the light source device 100 will be described in more detail below.

The liquid crystal panel 20 is provided in front of the light source device 100, and blocks or passes light emitted from the light source device 100 to form the image I.

A front surface of the liquid crystal panel 20 may form the screen S of the display apparatus 10 described above, and the liquid crystal panel 20 may form a plurality of pixels P. In the liquid crystal panel 20, the plurality of pixels P may each independently block or pass light of the light source device 100, and light passing through the plurality of pixels P may form the image I displayed on the screen 12.

For example, as shown in FIG. 3, the liquid crystal panel 20 may include a first polarizing film 21, a first transparent substrate 22, a pixel electrode 23, a thin film transistor (TFT) 24, a liquid crystal layer 25, a common electrode 26, a color filter 27, a second transparent substrate 28, and a second polarizing film 29.

The first transparent substrate 22 and the second transparent substrate 28 may fixedly support the pixel electrode 23, the TFT 24, the liquid crystal layer 25, the common electrode 26, and the color filter 27. The first and second transparent substrates 22 and 28 may be formed of tempered glass or transparent resin.

The first polarizing film 21 and the second polarizing film 29 are provided at outer sides of the first transparent substrate 22 and the second transparent substrate 28.

The first polarizing film 21 and the second polarizing film 29 may each pass a specific light and block the other light. For example, the first polarizing film 21 may pass light having a magnetic field oscillating in the first direction and block the other light. In addition, the second polarizing film 29 may pass light having a magnetic field oscillating in the second direction and block the other light. In this case, the first direction and the second direction may be orthogonal to each other. Accordingly, the polarization direction of light passing through the first polarizing film 21 and the vibration direction of light passing through the second polarizing film 29 are orthogonal to each other. As a result, light does not pass through the first polarizing film 21 and the second polarizing film 29 at the same time.

The color filter 27 may be provided at an inner side of the second transparent substrate 28.

The color filter 27 may include, for example, a red filter 27R for passing red light, a green filter 27G for passing green light, and a blue filter 27B for passing blue light. The red filter 27R, the green filter 27G, and the blue filter 27B may be arranged side by side. The color filter 27 is formed in an area corresponding to the pixel P described above. The area in which the red filter 27R is formed corresponds to the red sub-pixel $P_R$, the area in which the green filter 27G is formed corresponds to the green sub-pixel $P_G$, and the area in which the blue filter 27B is formed corresponds to the blue sub-pixel $P_B$.

The pixel electrode 23 may be provided at an inner side of the first transparent substrate 22, and the common electrode 26 may be provided at an inner side of the second transparent substrate 28.

The pixel electrode 23 and the common electrode 26 are formed of a metal material that conducts electricity, and may generate an electric field for changing the alignment of liquid crystal molecules 25a constituting the liquid crystal layer 25 to be described below.

The pixel electrode 23 and the common electrode 26 are formed of a transparent material, and may pass light incident from the outside. For example, the pixel electrode 23 and the common electrode 26 are be formed of indium tin oxide (ITO), indium zinc oxide (IZO), silver nanowire, carbon nanotube (CNT), graphene, PEDOT (3,4-ethylenedioxythiophene), or the like.

The TFT 24 may be provided at an inner side of the second transparent substrate 22.

The TFT 24 may pass or block a current flowing through the pixel electrode 23. For example, according to the TFT 24 being turn-on (closed) or turn-off (open), an electric field may be formed or removed between the pixel electrode 23 and the common electrode 26.

The TFT 24 may be formed of poly-silicon, and may be formed by a semiconductor process, such as lithography, deposition, or ion implantation.

The liquid crystal layer 25 may be formed between the pixel electrode 23 and the common electrode 26, and the liquid crystal layer 25 is filled with the liquid crystal molecules 25*a*.

Liquid crystals exhibit an intermediate state between a solid (a crystal) and a liquid. Most liquid crystal materials are formed of organic compounds, and have a molecule in the shape of a long and thin rod, and the alignment of molecules has an irregular form in one direction, but may have a regular crystal form in another direction. As a result, the liquid crystals have both the fluidity of a liquid and the optical anisotropy of a crystal (solid).

In addition, the liquid crystals exhibit optical properties according to a change in the electric field. For example, in the liquid crystal, the direction of the alignment of molecules constituting the liquid crystal may change according to a change in an electric field. When an electric field is generated in the liquid crystal layer 25, the liquid crystal molecules 25*a* of the liquid crystal layer 25 are aligned according to the direction of the electric field, and when an electric field is not generated in the liquid crystal layer 25, the liquid crystal molecules 25*a* are irregularly arranged or may be arranged along an alignment layer. As a result, the optical properties of the liquid crystal layer 25 may vary depending on the presence or absence of an electric field passing through the liquid crystal layer 25.

Referring to FIG. 2, the liquid crystal panel 20 is provided at one side with a cable 20*a* for transmitting image data to the liquid crystal panel 20, and a display driver integrated circuit (IC) (DDI) 30 (hereinafter referred to as 'driver IC') for processing digital image data and outputting an analog image signal.

The cable 20*a* may electrically connect the control assembly 50 and/or power assembly 60 to the driver IC 30, and also electrically connect the driver IC 30 to the liquid crystal panel 20. The cable 20*a* may include a flexible flat cable or a film cable that may be bent.

The driver IC 30 may receive image data and power from the control assembly 50/the power assembly 60 through the cable 20*a*, and supply image data and driving current to the liquid crystal panel 20 through the cable 20*a*.

In addition, the cable 20*a* and the driver IC 30 may be integrally provided using a film cable, a chip on film (COF), a tape carrier package (TCP), or the like. In other words, the driver IC 30 may be disposed on the cable 20*a*. However, the disclosure is not limited thereto, and the driver IC 30 may be disposed on the liquid crystal panel 20.

The control assembly 50 may include a control circuit for controlling operations of the liquid crystal panel 20 and the light source device 100. The control circuit may process image data received from an external content source, transmit image data to the liquid crystal panel 20, and transmit dimming data to the light source device 100.

The power assembly 60 may supply power to the liquid crystal panel 20 and the light source device 100 such that the light source device 100 outputs surface light and the liquid crystal panel 20 blocks or passes light of the light source device 100.

The control assembly 50 and the power assembly 60 may be implemented using a printed circuit board and various circuits mounted on the printed circuit board. For example, the power circuit may include a capacitor, a coil, a resistor, a processor, and the like, and a power circuit board on which the capacitor, the coil, the resistor, the processor and the like are mounted. In addition, the control circuit may include a memory, a processor, and a control circuit board on which the memory and processor are mounted.

Hereinafter, the light source device 100 will be described.

Figure 4:
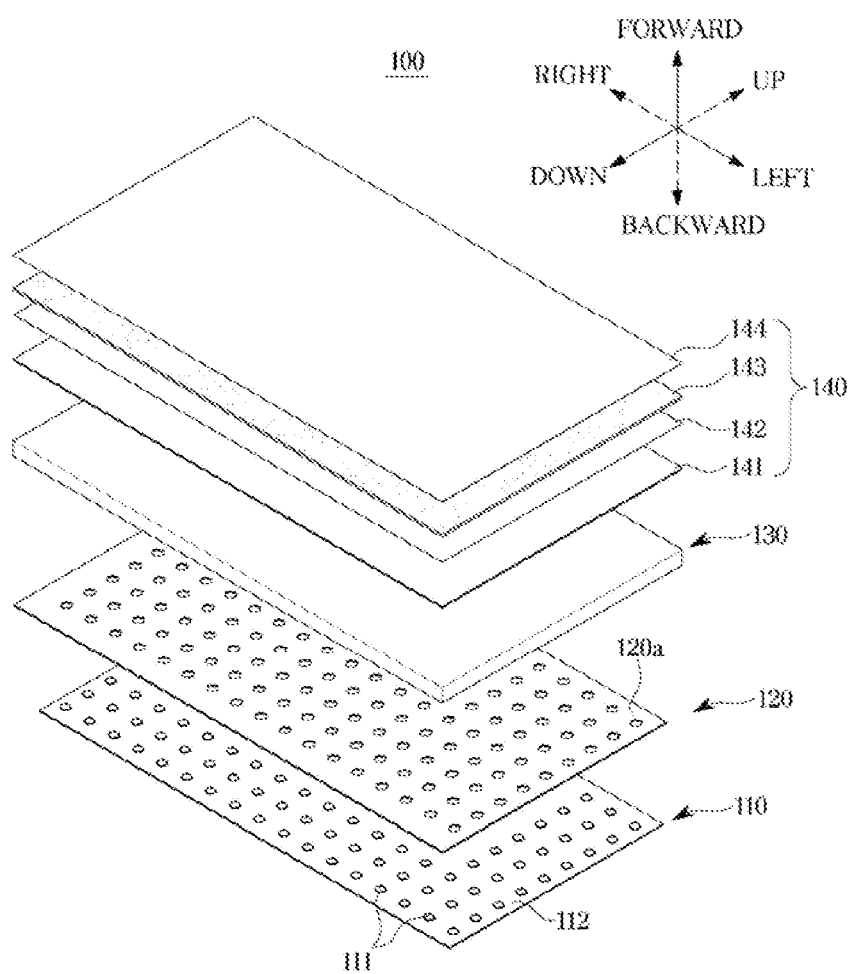
FIG. 4 is a diagram illustrating a light source device according to an embodiment.

FIG. 4 is a diagram illustrating a light source device according to an embodiment.

The light source device 100 includes a light source module 110 for generating light, a reflective sheet 120 for reflecting light, a diffuser plate 130 for uniformly diffusing light, and optical sheets 140 for improving the luminance of emitted light.

The light source module 110 may include a plurality of light sources 111 for emitting light and a substrate 112 for supporting/fixing the plurality of light sources 111.

The plurality of light sources 111 may be arranged in a predetermined pattern such that light is emitted with a uniform luminance. The plurality of light sources 111 may be arranged such that distances between one light source and light sources adjacent thereto are the same.

For example, as shown in FIG. 4, the plurality of light sources 111 may be arranged in rows and columns. Thereby, a plurality of light sources may be arranged such that four light sources adjacent to each other form a substantially square. In addition, one light source may be disposed adjacent to four light sources, and the distances between the one light source and the four adjacent light sources may be approximately the same.

As another example, a plurality of light sources may be arranged in a plurality of rows, and light sources belonging to a row may each be arranged at the center of two light sources belonging to rows adjacent to the row. Thereby, the plurality of light sources may be arranged such that the three adjacent light sources form an approximately equilateral triangle. In this case, one light source is disposed adjacent to six light sources, and the distances between the one light source and the six light sources adjacent thereto may be approximately the same.

However, a pattern in which the plurality of light sources 111 are disposed is not limited to the pattern described above, and the plurality of light sources 111 may be disposed in various patterns such that light is emitted with a uniform luminance.

The light source 111 may employ a device that, when supplied with power, emits monochromatic light (light of a specific wavelength, e.g., blue light) or white light (e.g., a mixture of red light, green light, and blue light) in various directions. For example, the light source 111 may include a light emitting diode (LED).

The substrate 112 may fix the plurality of light sources 111 such that the positions of the light sources 111 are not changed. In addition, the substrate 112 may supply power to each light source 111 for the light source 111 to emit light.

The substrate 112 may be formed of a synthetic resin or tempered glass or a printed circuit board (PCB) that may fix the plurality of light sources 111 and in which a conductive feed line for supplying power to the light source 111 is formed.

The reflective sheet 120 may reflect light emitted from the plurality of light sources 111 forward or in a direction close to the front.

The reflective sheet 120 may be formed with a plurality of through holes 120*a* at positions corresponding to the plurality of light sources 111 of the light source module 110. In addition, the light source 111 of the light source module 110 may pass through the through hole 120*a* and protrude forward of the reflective sheet 120.

For example, in a process of assembling the reflective sheet 120 and the light source module 110, the plurality of light sources 111 of the light source module 110 are inserted into the plurality of through holes 120*a* formed in the reflective sheet 120. Therefore, while the substrate 112 of the light source module 110 is positioned behind the reflective sheet 120, the plurality of light sources 111 of the light source module 110 may be positioned in front of the reflective sheet 120.

Accordingly, the plurality of light sources 111 may emit light from the front of the reflective sheet 120.

The plurality of light sources 111 may emit light in various directions from the front of the reflective sheet 120. Light may be emitted from the light source 111 not only toward the diffusion plate 130 but also toward the reflective sheet 120, and the light emitted toward the reflective sheet 120 may be reflected by the reflective sheet 120 toward the diffusion plate 130.

Light emitted from the light source 111 passes through various objects, such as the diffusion plate 130 and the optical sheets 140. When light passes through the diffuser plate 130 and the optical sheets 140, some of the incident light is reflected from the surfaces of the diffuser plate 130 and the optical sheets 140. The reflective sheet 120 may reflect light reflected by the diffusion plate 130 and the optical sheets 140.

The diffusion plate 130 may be provided in front of the light source module 110 and the reflective sheet 120, and may evenly distribute light emitted from the light source 111 of the light source module 110.

As described above, the plurality of light sources 111 are located in various places on the rear surface of the light source device 100. Although the plurality of light sources 111 are disposed at equal intervals on the rear surface of the light source device 100, non-uniformity in luminance may occur depending on the positions of the plurality of light sources 111.

The diffusion plate 130 may allow light emitted from the plurality of light sources 111 to be diffused inside the diffusion plate 130 to remove the non-uniformity of luminance caused due to the plurality of light sources 111. In other words, the diffusion plate 130 may allow non-uniform light from the plurality of light sources 111 to be uniformly emitted to the front.

The optical sheets 140 may include various sheets for improving the luminance and the uniformity of luminance. For example, the optical sheets 140 may include a diffusion sheet 141, a first prism sheet 142, a second prism sheet 143, and a reflective polarizing sheet 144.

The diffusion sheet 141 diffuses light for uniformity of luminance. Light emitted from the light source 111 may be diffused by the diffusion plate 130 and may be diffused again by the diffusion sheet 141 included in the optical sheets 140.

The first and second prism sheets 142 and 143 may increase luminance by focusing the light diffused by the diffusion sheet 141. The first and second prism sheets 142 and 143 include a prism pattern having a triangular prism shape, and a plurality of the prism patterns are arranged adjacent to each other to form a plurality of bands.

The reflective polarizing sheet 144 is a type of polarizing film and may transmit some portion of incident light and reflect the other portion to improve luminance. For example, the reflective polarizing sheet 144 may transmit polarized light having the same direction as a predetermined polarization direction of the reflective polarizing sheet 144 and reflect polarized light having a direction different from the polarization direction of the reflective polarizing sheet 144. In addition, the light reflected by the reflective polarizing sheet 144 is recycled inside the light source device 100, and such a light recycle may improve the luminance of the display apparatus 10.

The optical sheets 140 are not limited to the sheets or films shown in FIG. 4, and may include more various sheets or films, such as a protective sheet and a quantum dot sheet.

Figure 5:
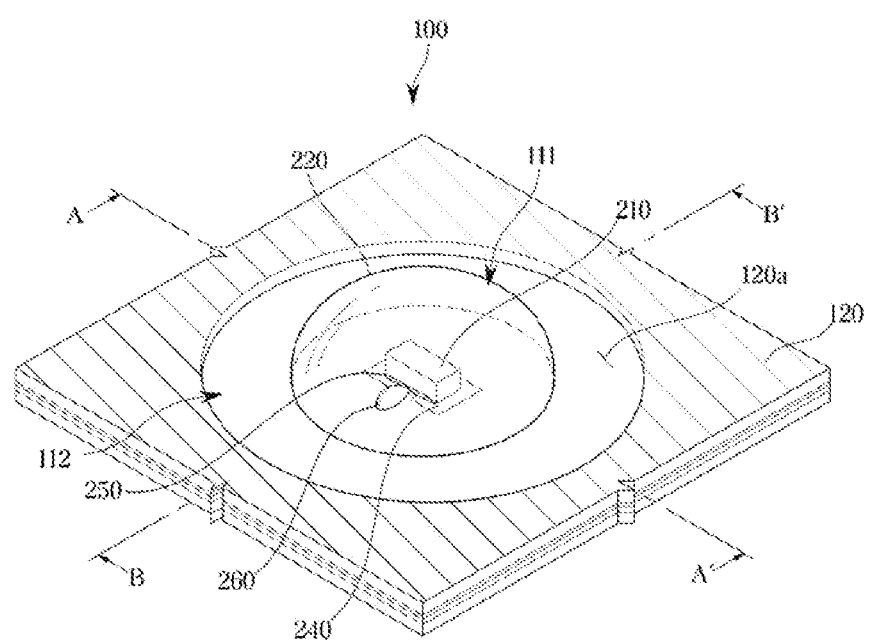
FIG. 5 is a diagram illustrating a part of a light source device according to an embodiment.
Figure 6:
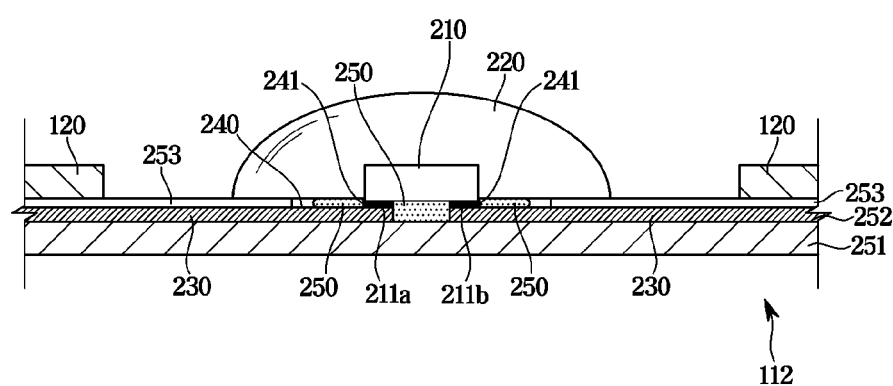
FIG. 6 is a cross-sectional view taken along line A-A' of FIG. 5 according to an embodiment.
Figure 7:
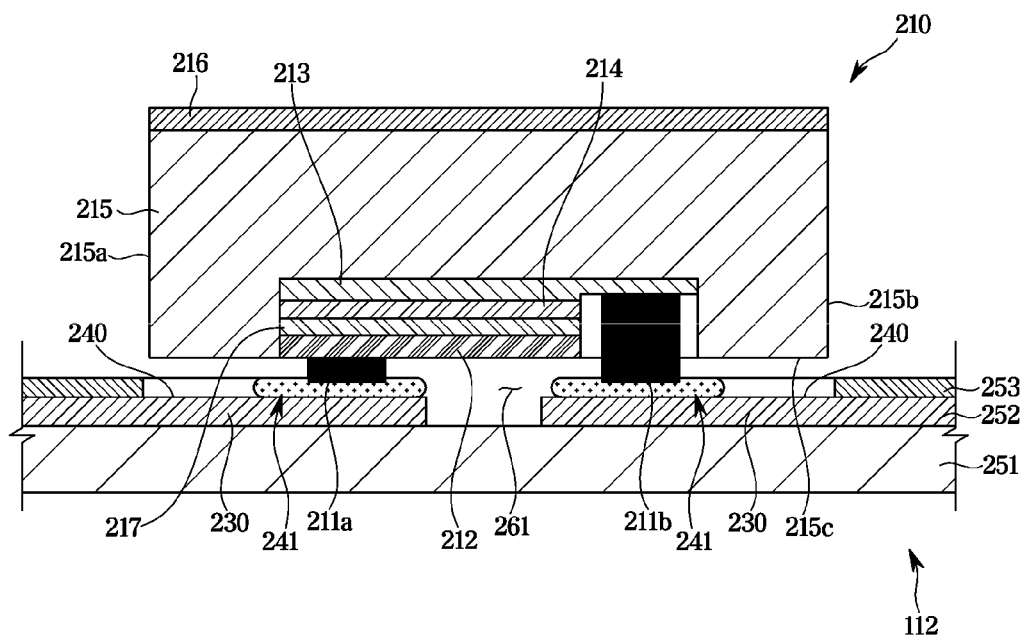
FIG. 7 is a diagram of the LED chip shown in FIG. 6, which shows a state before a solder paste is subjected to reflow, according to an embodiment.

FIG. 5 is a diagram illustrating a part of a light source device according to an embodiment. FIG. 6 is a cross-sectional view taken along line A-A' of FIG. 5 according to an embodiment. FIG. 7 is a diagram of the LED chip shown in FIG. 6, which shows a state before a solder paste is subjected to reflow, according to an embodiment.

The light source 111 of the light source device 100 is described with reference to FIGS. 5 and 6.

As described above, the light source module 110 includes a plurality of light sources 111. The plurality of light sources 111 may pass through the through holes 120a from the rear of the reflective sheet 120 to protrude forward of the reflective sheet 120. Accordingly, as shown in FIGS. 5 and 6, the light source 111 and a portion of the substrate 112 may be exposed through the through hole 120a to the front of the reflective sheet 120.

The light source 111 may include an electrical/mechanical structure positioned in a region defined by the through hole 120a of the reflective sheet 120.

According to the aspect of the disclosure, each of the plurality of light sources 111 may include an LED chip 210 and an optical dome 220.

The LED chip 210 may include a p-type semiconductor layer 213 and an n-type semiconductor layer 212 configured to emit light by recombination of holes and electrons. In addition, the LED chip 210 is provided with a pair of electrodes 211a and 211b configured to supply holes and electrons to the p-type semiconductor layer 213 and the n-type semiconductor layer 212, respectively.

According to an embodiment of the disclosure, the LED chip 210 may include a growth substrate 215, a p-type semiconductor layer 213, an n-type semiconductor layer 212, and a light emission layer 214.

The growth substrate 215 may be provided using a sapphire substrate useful as a substrate for nitride semiconductor growth. However, the disclosure is not limited thereto, and may be implemented using various substrates, such as a silicon substrate or a GaN substrate, that may be provided for semiconductor single crystal growth. According to an embodiment of the disclosure, the growth substrate 215 may be provided using a sapphire substrate.

The p-type semiconductor layer 213, the n-type semiconductor layer 212, and the light emission layer 214 may be formed of a nitride semiconductor. The light emission layer 214 may emit light at a bandgap energy by recombination of electrons and holes.

The pair of electrodes 211a and 211b may include an n-type device electrode 211a and a p-type device electrode 211b. The n-type device electrode 211a and the p-type device electrode 211b may be formed of a material that allows for ohmic contact with a nitride semiconductor, for example, formed of a metal, such as silver (Ag) or aluminum (Al).

Referring to FIG. 7, according to an embodiment of the disclosure, the LED chip 210 may further include a first distributed Bragg reflector (DBR) layer 216 and a second DBR layer 217. However, the disclosure is not limited thereto, and the LED chip 210 may not include the first DBR layer 216 and/or the second DBR layer 217.

The first DBR layer 216 and the second DBR layer 217 may be prepared by stacking two materials having a difference in refractive index. The first DBR layer 216 and the second DBR layer 217 may reflect light of a target wavelength.

The first DBR layer 216 may be provided on an upper surface of the growth substrate 215. The first DBR layer 216 may reflect a portion of the light emitted from the light emission layer 214 to increase the directivity angle of light with respect to the liquid crystal panel 20.

The second DBR layer 217 may be provided on a lower surface of the light emission layer 214. Similar to the first DBR layer 216, the second DBR layer 217 may reflect a portion of the light emitted from the light emission layer 214 to increase the directivity angle of light with respect to the liquid crystal panel 20. Alternatively, the LED chip 210 may include a metal reflective layer instead of the second DBR layer. The metal reflective layer may be provided on a lower surface of the light emission layer 214 similar to the second DBR layer 217, and the metal reflective layer may include aluminum Al.

According to an embodiment of the disclosure, a DBR layer may be provided on an upper surface of the growth substrate 215, and a DBR layer may be provided on a lower surface of the light emission layer 214. Specifically, the first DBR layer 216 may be provided on the upper surface of the growth substrate 215, and the second DBR layer 217 may be provided on the lower surface of the light emission layer 214. In this way, the LED chip 210 according to an embodiment of the disclosure may be provided with a pair of DBR layers on the opposite sides of the light emission layer 214.

The LED chip 210 may convert electrical energy into optical energy. In other words, the LED chip 210 may emit light having a maximum intensity at a predetermined wavelength in which power is supplied. For example, the LED chip 210 may emit blue light having a peak value at a wavelength representing blue (e.g., a wavelength between 450 nm and 495 nm). Alternatively, the LED chip 210 may emit white light.

The LED chip 210 may be directly attached to the substrate 112 in a Chip On Board (COB) method. In other words, the light source 111 may include the LED chip 210 in which a light emitting diode chip or a light emitting diode die is directly attached to the substrate 112 without separate packaging.

In the LED chip 210, the first DBR layer 216 may have a traverse side and a longitudinal side, the length of which may be provided in several hundreds of μm. In other words, the upper surface of the growth substrate 215 may have a traverse side and a longitudinal side, the length of which may be provided in several hundreds of μm. Preferably, the upper surface of the growth substrate 215 may have a traverse side and a longitudinal side, the length of which may be provided to be less than or equal to 500 μm.

In order to reduce an area occupied by the LED chip 210, the LED chip 210 may be manufactured as a flip chip type that does not include a Zener diode. The LED chip 210 provided in a flip chip type may not use an intermediate medium, such as a metal lead (a wire) or a ball grid array (BGA) when the light emitting diode, which is a semiconductor device, is attached to the substrate 112. The LED chip 210 provided in a flip chip type may directly fuse an electrode pattern of a semiconductor device to the substrate 112.

As described above, because the metal lead (a wire) or the BGA is omitted, the light source 111 including the flip-chip type LED chip 210 may be miniaturized.

In order to miniaturize the light source 111, the light source module 110 in which the flip-chip type LED chip 210 is attached to the substrate 112 in a COB method may be manufactured.

On the substrate 112, a feed line 230 and a feed pad 240 are provided to supply power to the LED chip 210 of a flip chip type.

The substrate 112 may be provided with the feed line 230 for supplying the LED chip 210 with an electrical signal and/or power from the control assembly 50 and/or the power assembly 60.

As shown in FIG. 6, the substrate 112 may be formed by alternately stacking an insulation layer 251 being of non-conductivity and a conduction layer 252 being of conductivity.

The conduction layer 252 is formed with a line or pattern that passes power and/or electrical signals. The conduction layer 252 may be formed of various materials having electrical conductivity. For example, the conduction layer 252 may be formed of various metal materials, such as copper (Cu), tin (Sn), or aluminum (Al), or an alloy thereof.

The dielectric of the insulation layer 251 may insulate the lines or patterns of the conduction layer 252. The insulation layer 251 may be formed of a dielectric for electrical insulation, e.g., FR-4.

The feed line 230 may be implemented by a line or pattern formed in the conduction layer 252.

The feed line 230 may be electrically connected to the LED chip 210 through the feed pad 240.

The feed pad 240 may be formed by exposing a portion of the feed line 230 to the outside.

The substrate 112 is provided at the outermost portion thereof with a protection layer 253 for preventing or suppressing the substrate 112 from being damaged due to external impact and/or chemical action (e.g., corrosion, etc.) and/or due to optical action. The protection layer 253 may include a photo solder resist (PSR).

As shown in FIG. 6, the protection layer 253 may cover the feed line 230 to prevent the feed line 230 from being exposed to the outside.

For electrical contact between the feed line 230 and the LED chip 210, the protection layer 253 may include a window that exposes a portion of the feed line 230 to the outside. The portion of the feed line 230 exposed to the outside by the window of the protection layer 253 may form the feed pad 240.

The feed pad 240 may have a solder paste 241 applied thereon for electrical contact between the feed line 230 exposed to the outside and the electrodes 211a and 211b of the LED chip 210. The solder paste 241 may be applied in the window of protection layer 253.

The electrodes 211a and 211b of the LED chip 210 may be in contact with the solder paste 241, such that the LED chip 210 may be electrically connected to the feed line 230 through the solder paste 241. Specifically, the solder paste 214 may be formed to reflow such that the LED chip 210 may be electrically connected to the feed line 230.

The solder paste 241 may include solder powder and a flux. As the solder paste 241 is subjected to a reflow process, the solder powder may cause the electrodes 211a and 211b of the LED chip 210 to be electrically connected to the feed pad 240. The feed pad 240 may cause the LED chip 210 to be electrically connected to the feed line 230.

Power may be supplied to the LED chip 210 through the feed line 230 and the feed pad 240, and the LED chip 210 when supplied with power may emit light. The feed pad 240 may be provided in a pair corresponding to the pair of electrodes 211a and 211b provided in the LED chip 210 of a flip chip type.

The optical dome 220 may cover the LED chip 210. The optical dome 220 may represent a light-transmitting resin layer. The optical dome 220 may prevent or suppress damage to the LED chip 210 by an external mechanical action and/or by a chemical action. The optical dome 220 may prevent the LED chip 210 from being separated from the substrate 112 by an external impact.

In addition, the optical dome 220 may increase the light extraction efficiency of the LED chip 210 through index matching. Due to a difference in refractive index between the growth substrate 215 and air, light emitted to the growth substrate 215 may not be emitted to the outside. The optical dome 220 reduces the refractive index difference between the growth substrate 215 and the air such that light emitted from the LED chip 210 is output to the outside through the growth substrate 215 and the optical dome 220.

In addition, the optical dome 220 may protect the light emitting diode 111 from an external electrical action. Charges generated by an electrostatic discharge may flow along the outer surface of the optical dome 220 without passing through the optical dome 220.

The optical dome 220 may have, for example, a dome shape, which is a portion of a sphere cut with a surface excluding the center of the sphere, or a hemispherical shape, which is a portion of a sphere cut with a surface including the center of the sphere. The optical dome 220 may have a vertical cross-section, for example, in an arcuate or semicircular shape.

The optical dome 220 may be formed of silicone or epoxy resin. For example, a molten silicone or epoxy resin may be discharged onto the LED chip 210 through a nozzle or the like, and then the discharged silicone or epoxy resin may be cured to form the optical dome 220.

The optical dome 220 may be optically transparent or translucent. Light emitted from the LED chip 210 may pass through the optical dome 220 and exit.

In this case, the optical dome 220 having a dome shape may refract light similar to a lens. For example, light emitted from the LED chip 210 may be dispersed by being refracted by the optical dome 220.

As described above, the optical dome 220 may not only protect the LED chip 210 from external mechanical action and/or chemical action or electrical action, but may also disperse light emitted from the LED chip 210.

In the following description, reference numerals 215a and 215b indicate opposite side surfaces of the growth substrate 215 in the cross-sectional view taken along line A-A' of FIG. 5, and a reference numeral 215C indicates a lower surface of the growth substrate 215 in the cross-sectional view taken along line A-A' of FIG. 5.

Referring to FIG. 7, the solder paste 241 may be applied on the feed pad 240, which is formed by a portion of the feed line 230 exposed to the outside of the protection layer 253. The solder paste 241 may be applied on one region of the feed pad 240 in a cream form. The LED chip 210 may be disposed on the substrate 112 such that each of the electrodes 211a and 211b of the LED chip 210 comes in contact with the solder paste 241.

In this case, air 261 exists between the LED chip 210 and the substrate 112. More specifically, the air 261 exists between a lower surface of the LED chip 210 and an upper surface of the substrate 112, and the air 261 may be discharged to the inside of the optical dome 220. The air 261 inside the optical dome 220 may not be discharged to the outside of the optical dome 220 but may form a void. Such a void may degrade the light uniformity of the LED chip 210.

Light emitted from the light emission layer 214 may pass through the growth substrate 215 and exit the LED chip 210. Because the optical dome 220 surrounds the LED chip 210, the light emitted from the light emission layer 214 may pass through the growth substrate 215 and the optical dome 220 and then to the outside of the optical dome 220. According to an embodiment of the disclosure, the growth substrate 215 may be a sapphire substrate, and the sapphire substrate has a refractive index of 1.7. According to an embodiment of the disclosure, the optical dome 220 may have a refractive index of 1.5. As such, the difference between the refractive indices of the growth substrate 215 and the optical dome 220 is not large, and thus the light emitted from the growth substrate 215 may not be reflected by the optical dome 220 but may pass through the optical dome 220 to the outside of the optical dome 220.

Air has a refractive index of 1.0 as described above, the air 261 between the LED chip 210 and the substrate 112 may form a void inside the optical dome 220. When the void comes into contact with the side surface or upper surface of the growth substrate 215, light emitted from the growth substrate 215 may be reflected by the air. Because the refractive index of the sapphire substrate is 1.7 and the refractive index of air is 1.0, the difference in refractive index is large so that light may not pass through the void but be reflected. That is, the movement path of light emitted from the light emission layer 214 may be changed due to the void. When the light movement paths are changed, light uniformity may be lowered. A poor light uniformity may give an appearance that there is a spot on the screen of the display apparatus, which may lower the satisfaction of the consumer and the marketability.

Figure 8:
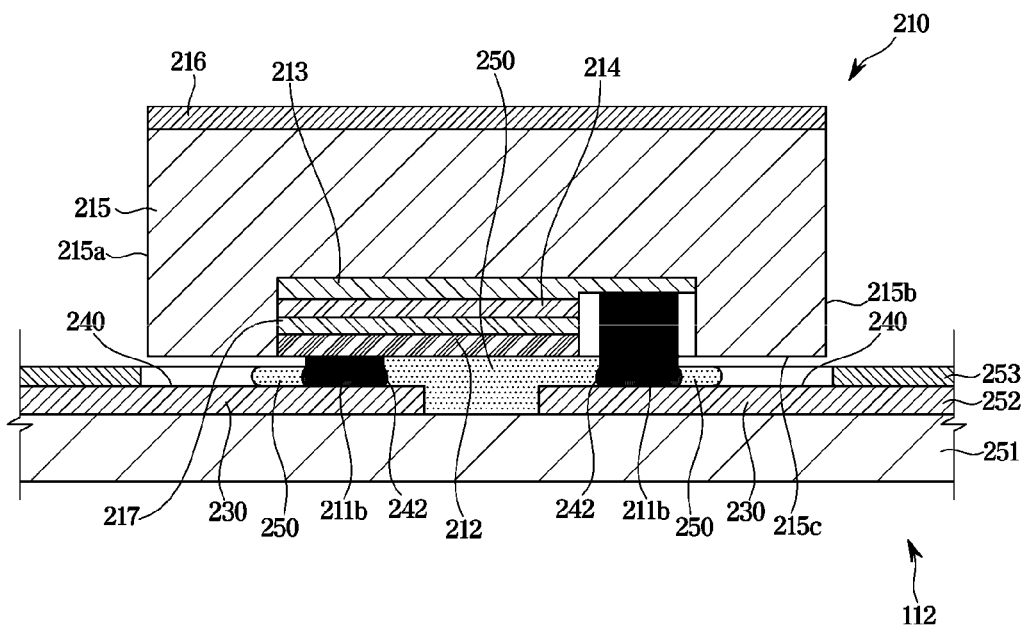
FIG. 8 is a diagram of the LED chip shown in FIG. 6, which shows a state after a solder paste is subjected to reflow, according to an embodiment.

FIG. 8 is a diagram of the LED chip shown in FIG. 6, which shows a state after a solder paste is subjected to reflow, according to an embodiment.

Referring to FIG. 8, when the solder paste 241 is subjected to a reflow process, the solder paste 241 may be melted and separated into solder powder 242 and a flux. The solder powder 242 may be positioned between the electrodes 211a and 211b of the LED chip 210 and the feed pad 240 to electrically connect the electrodes 211a and 211b of the LED chip 210 to the feed pad 240. The flux may in a viscous liquid state, and positioned between the LED chip 210 and the substrate 112. The flux may fill a gap between the LED chip 210 and the substrate 112. Hereinafter, the flux filling the gap between the LED chip 210 and the substrate 112 is referred to as an air barrier 250.

The air barrier 250 may be formed by reflowing the solder paste 241. The air barrier 250 may fill the gap between the LED chip 210 and the substrate 112 to prevent or delay air between the LED chip 210 and the substrate 112 from moving into the optical dome 220. The air barrier 250 may include the flux of the solder paste 241.

Figure 9:
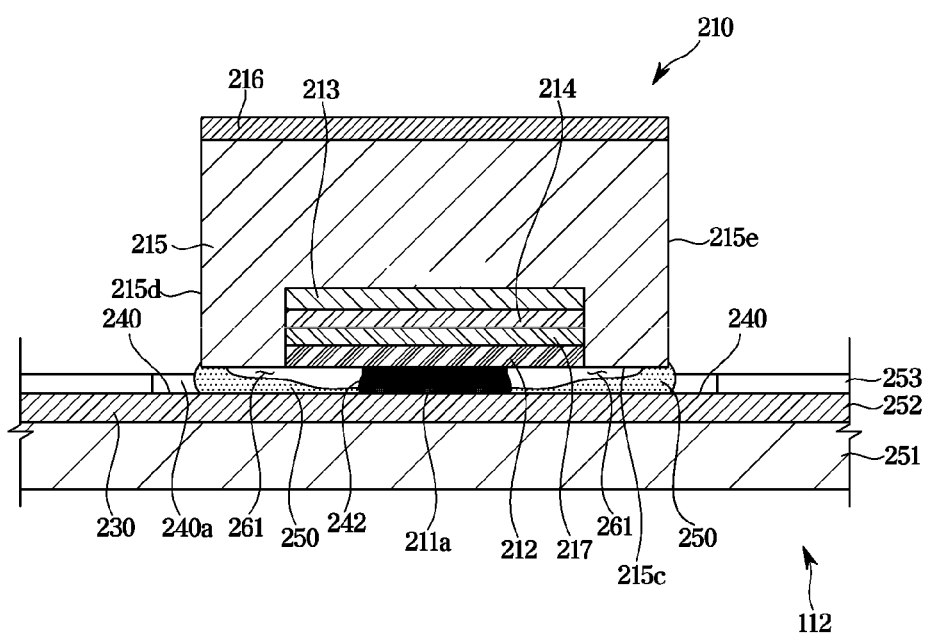
FIG. 9 is a cross-sectional view taken along line B-B' of FIG. 5, which shows an enlarged view of a light emitting diode (LED) chip, according to an embodiment.

FIG. 9 is a cross-sectional view taken along line B-B' of FIG. 5, which shows an enlarged view of a light emitting diode (LED) chip, according to an embodiment.

In the following description, reference numerals 215d and 215e indicate opposite side surfaces of the growth substrate 215 in a cross-sectional view taken along line B-B' of FIG. 5.

Referring to FIG. 9, the air barrier 250 is positioned between the LED chip 210 and the substrate 112 to prevent the air 261 between the LED chip 210 and the substrate 112 from moving to the outside. On the other hand, the air barrier 250 may not completely block the gap between the LED chip 210 and the substrate 112. However, the gap between the LED chip 210 and the substrate 112 may be reduced by the air barrier 250, and the air 261 may slowly move through the gap to the outside. That is, the air bather 250 may delay the air 261 between the LED chip 210 and the substrate 112 from moving to the outside.

Figure 10:
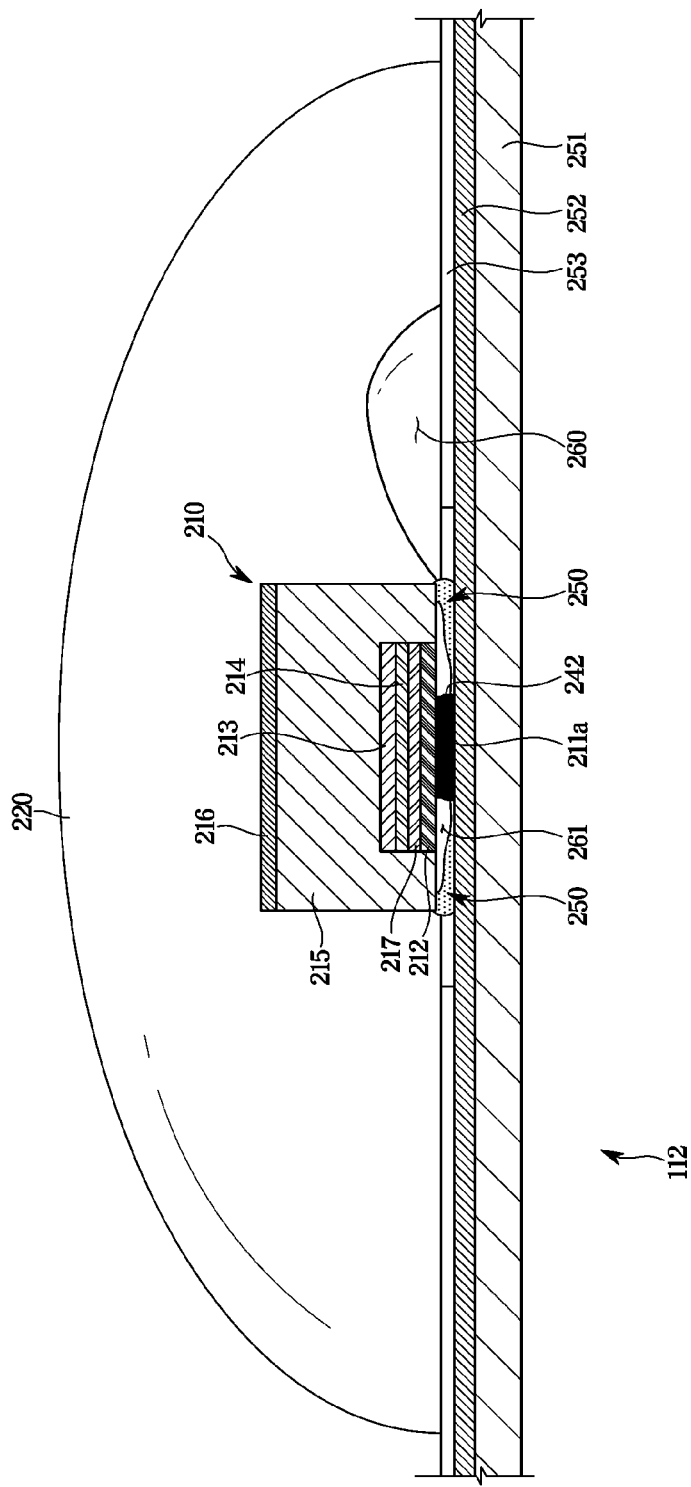
FIG. 10 is a cross-sectional view taken along line B-B' of FIG. 5, according to an embodiment.

FIG. 10 is a cross-sectional view taken along line B-B' of FIG. 5, according to an embodiment.

Referring to FIG. 10, the air 261 between the LED chip 210 and the substrate 112 may pass through the gap that is reduced by the air bather 250 and form a void 260 inside the optical dome 220.

According to an aspect of the disclosure, the void 260 formed in the optical dome 220 may be spaced apart from the LED chip 210 by the air barrier 250. In other words, the void 260 may not be in contact with the growth substrate 215. With such a configuration, light emitted through the side surface or the upper surface of the growth substrate 215 is prevented from being reflected by the air inside the void 260 and having a changed optical path. In addition, a decrease in light uniformity due to a changed light path may be prevented. In addition, such a configuration may prevent a portion on the screen of the display apparatus from being recognized as a spot.

Figure 11:
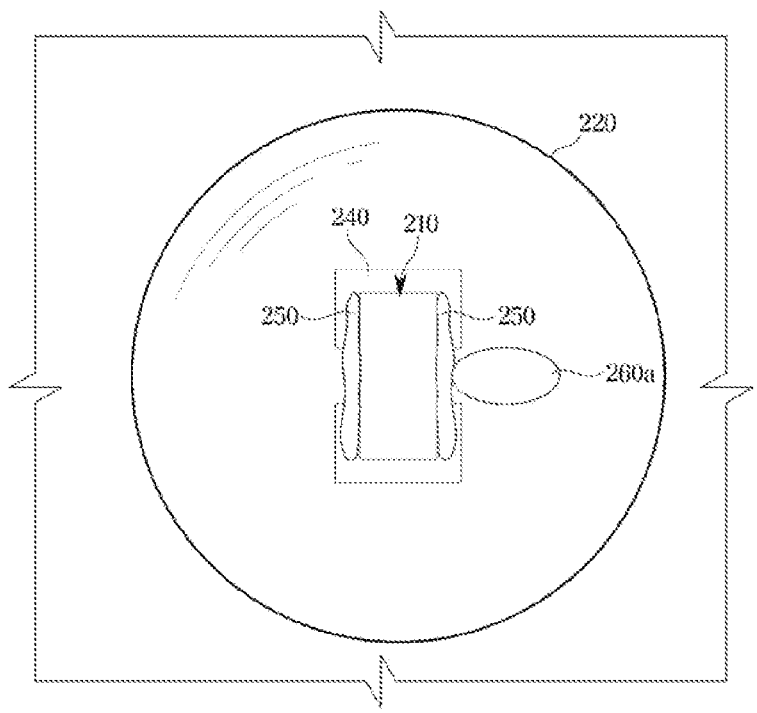
FIG. 11 is a diagram illustrating an LED chip and an optical dome according to an embodiment.

FIG. 11 is a diagram illustrating an LED chip and an optical dome according to an embodiment.

Referring to FIG. 11, the LED chip 210 according to the embodiment of the disclosure may include the air barrier 250.

The air barrier 250 may extend in the first direction. In this case, the first direction may indicate a direction in which the pair of power feed pads 240 are arranged in parallel with each other. The first direction may indicate an upper-lower direction in FIG. 11.

The air barriers 250 may be provided on opposite sides of the LED chip 210. That is, the air barrier 250 may be provided as a pair.

The pair of air barriers 250 may be disposed to be spaced apart from each other by a predetermined distance in the second direction crossing the first direction. The second direction may indicate a left-right direction in FIG. 11.

According to the embodiment of the disclosure, a void 260a may be formed on one side of the LED chip 210. Specifically, the void 260a may be formed on the right side of the LED chip 210 in the drawing.

Figure 12:
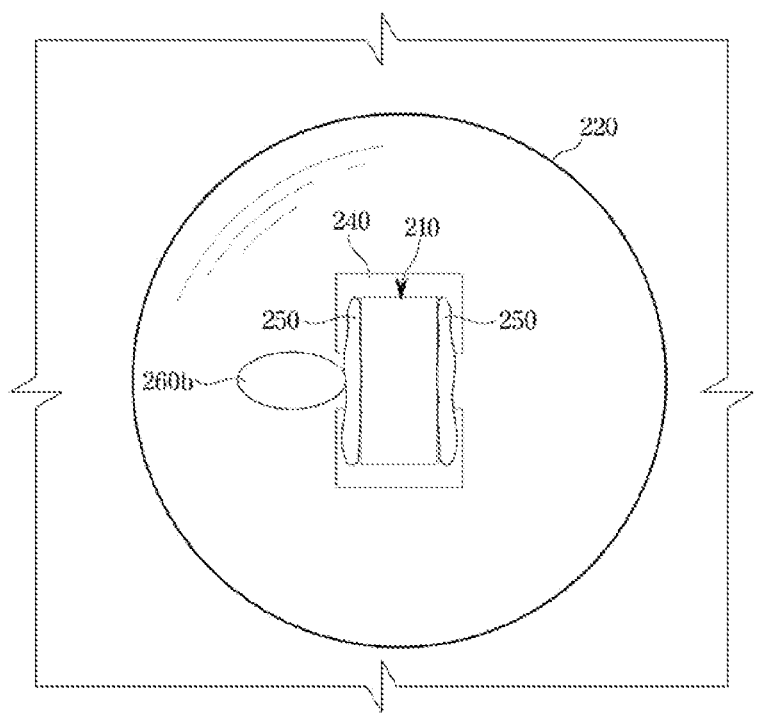
FIG. 12 is a diagram illustrating an LED chip and an optical dome according to an embodiment.

FIG. 12 is a diagram illustrating an LED chip and an optical dome according to an embodiment.

Referring to FIG. 12, a void 260b may be formed on one side of the LED chip 210. Specifically, the void 260b may be formed on the left side of the LED chip 210 in the drawing.

Figure 13:
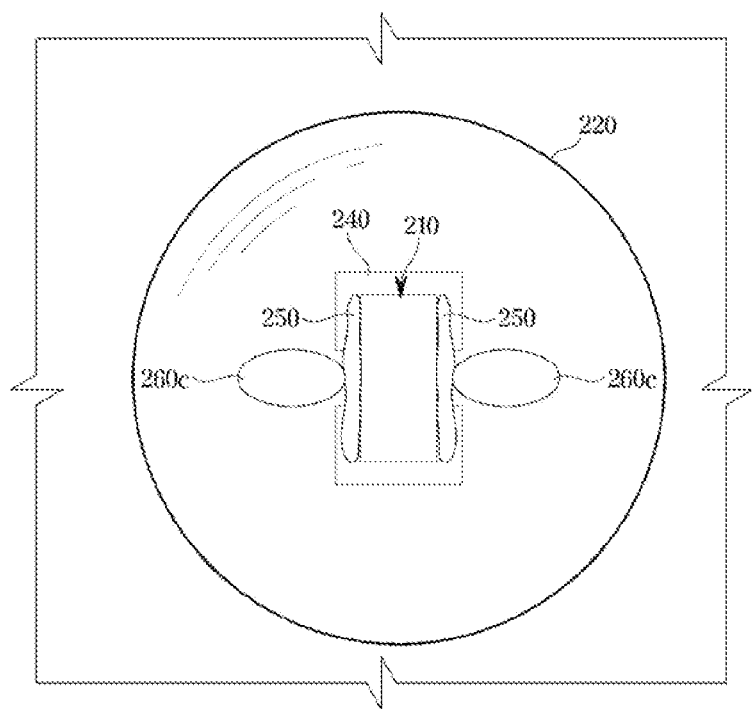
FIG. 13 is a diagram illustrating an LED chip and an optical dome according to an embodiment.

FIG. 13 is a diagram illustrating an LED chip and an optical dome according to an embodiment.

Referring to FIG. 13, a plurality of voids 260c may be provided. For example, the void 260c may be provided as a pair.

The pair of voids 260c may be respectively formed on the opposite sides of the LED chip 210. Specifically, the pair of voids 260c may be respectively formed on the left side and the right side of the LED chip 210 in the drawing.

Figure 14:
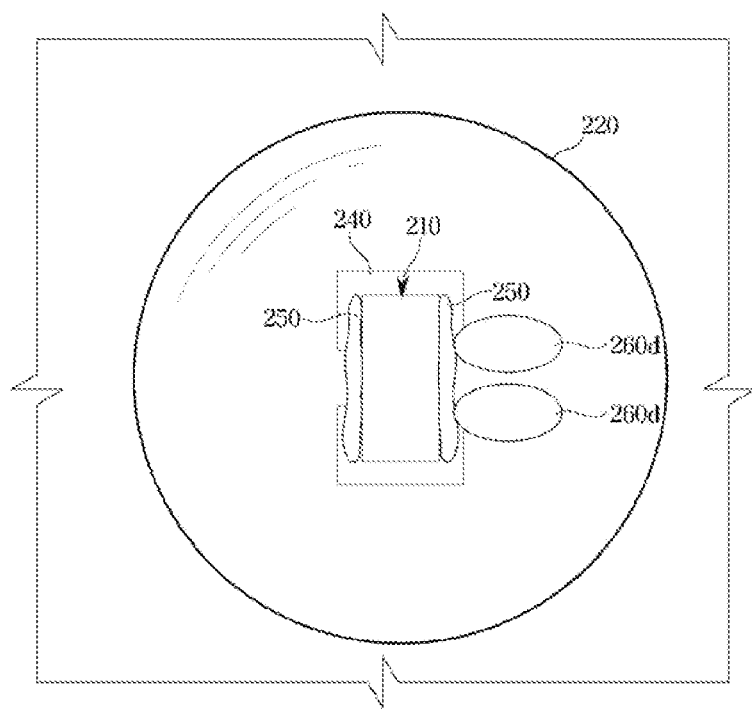
FIG. 14 is a diagram illustrating an LED chip and an optical dome according to an embodiment.

FIG. 14 is a diagram illustrating an LED chip and an optical dome according to an embodiment.

Referring to FIG. 14, a plurality of voids 260d may be provided. For example, the void 260d may be provided as a pair.

The pair of voids 260d may be formed on one side of the LED chip 210. Specifically, the pair of voids 260d may be formed on the right side of the LED chip 210 in the drawing.

Figure 15:
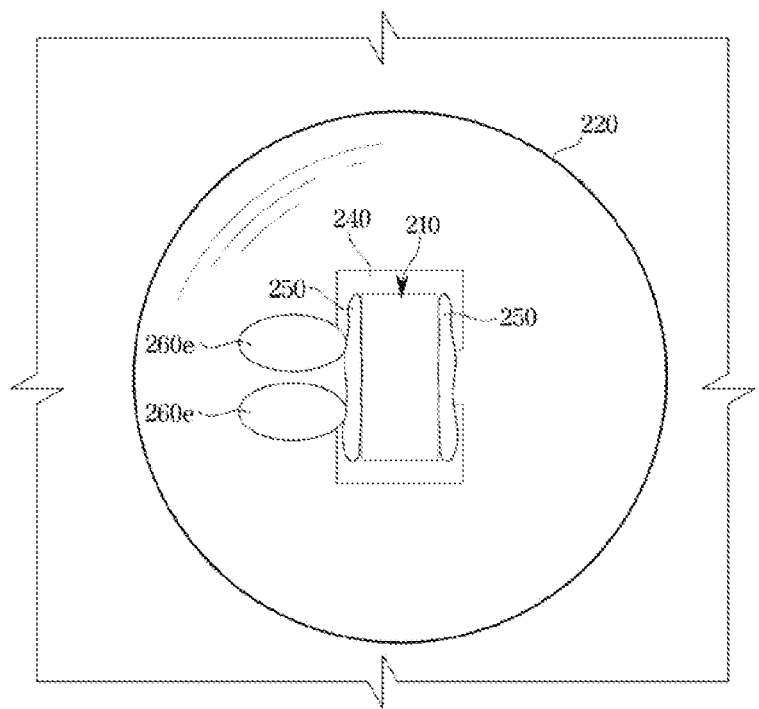
FIG. 15 is a diagram illustrating an LED chip and an optical dome according to an embodiment.

FIG. 15 is a diagram illustrating an LED chip and an optical dome according to an embodiment.

Referring to FIG. 15, a plurality of voids 260e may be provided. For example, a pair of voids 260e may be provided.

The pair of voids 260e may be formed on one side of the LED chip 210. Specifically, the pair of voids 260e may be formed on the left side of the LED chip 210 in the drawing.

Figure 16:
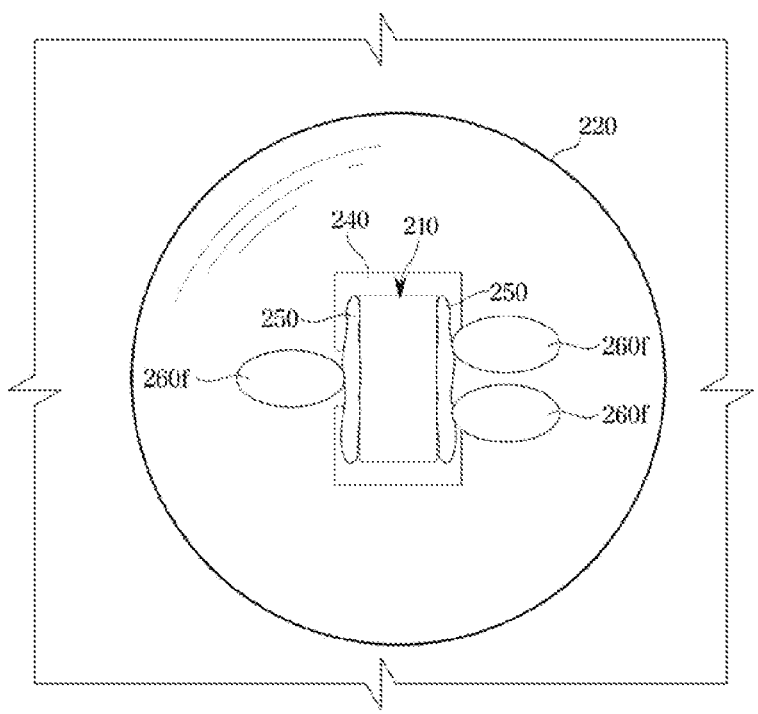
FIG. 16 is a diagram illustrating an LED chip and an optical dome according to an embodiment.

FIG. 16 is a diagram illustrating an LED chip and an optical dome according to an embodiment.

Referring to FIG. 16, a plurality of voids 260f may be provided. For example, three voids 260f may be provided.

The plurality of voids 260f may be formed on the opposite sides of the LED chip 210. Specifically, two voids 260f may be formed on the right side of the LED chip 210 in the drawing, and one void 260f may be formed on the left side of the LED chip 210 in the drawing.

Figure 17:
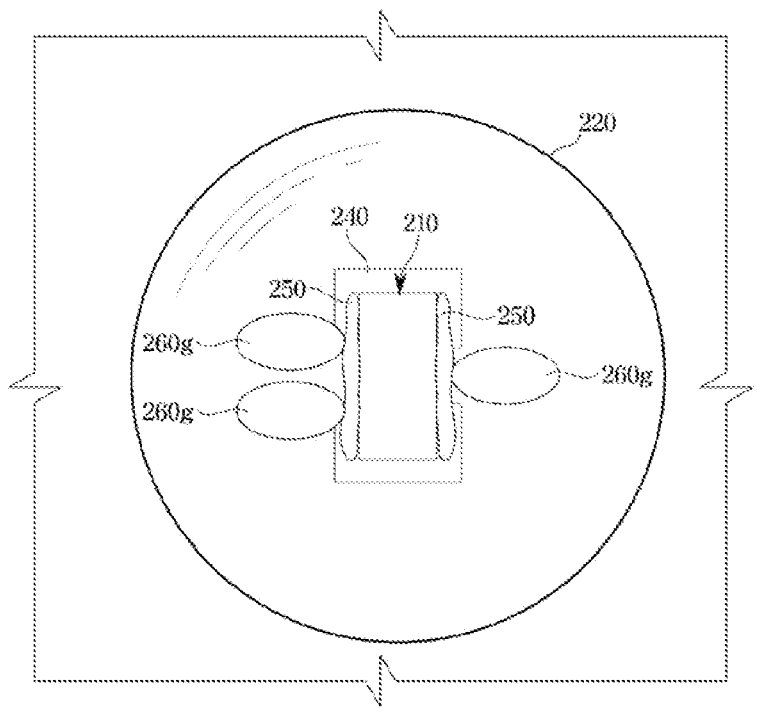
FIG. 17 is a diagram illustrating an LED chip and an optical dome according to an embodiment.

FIG. 17 is a diagram illustrating an LED chip and an optical dome according to an embodiment.

Referring to FIG. 17, a plurality of voids 260g may be provided. For example, three voids 260g may be provided.

The plurality of voids 260g may be formed on the opposite sides of the LED chip 210. Specifically, two voids 260g may be formed on the left side of the LED chip 210 in the drawing, and one void 260g may be formed on the right side of the LED chip 210 in the drawing.

Figure 18:
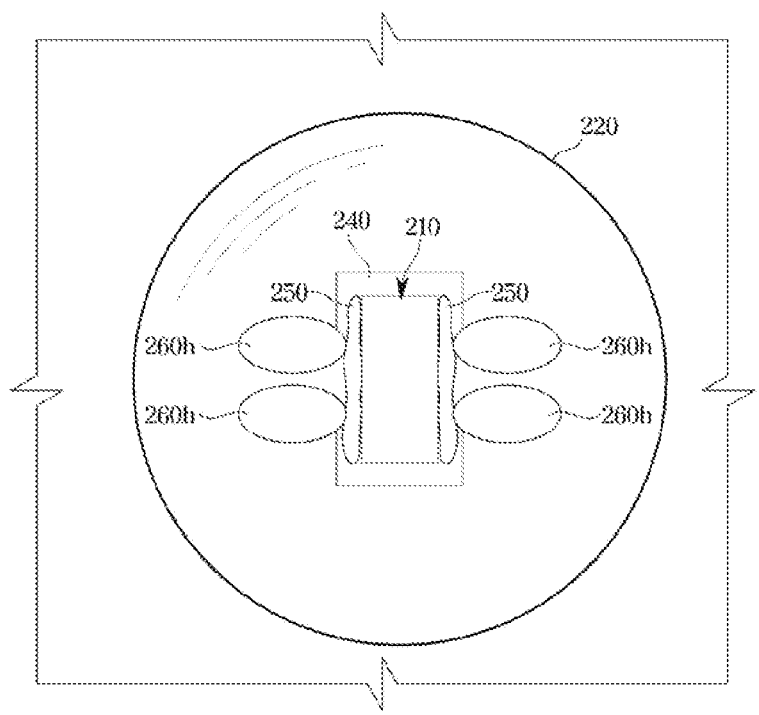
FIG. 18 is a diagram illustrating an LED chip and an optical dome according to an embodiment.

FIG. 18 is a diagram illustrating an LED chip and an optical dome according to an embodiment.

Referring to FIG. 18, a plurality of voids 260h may be provided. For example, four voids 260h may be provided.

The plurality of voids 260h may be formed on the opposite sides of the LED chip 210. Specifically, two voids 260h may be formed on the left side of the LED chip 210 in the drawing, and the remaining two voids 260h may be formed on the right side of the LED chip 210 in the drawing.

In addition to the examples shown in FIGS. 11 to 18, the voids may be formed in various numbers and shapes.

Although a few embodiments of the disclosure have been shown and described, the above embodiments are for illustrative purposes only, and it would be appreciated by those skilled in the art that changes and modifications may be made in these embodiments without departing from the principles and scope of the disclosure, the scope of which is defined in the claims and their equivalents.

What is claimed is:

1. A display apparatus comprising:
   a printed circuit board (PCB);
   a light emitting diode (LED) chip provided on the PCB and configured to output light;
   a gap between the LED chip and the PCB, the gap being under the LED chip and over the PCB;
   an optical dome provided on the PCB and covering the LED chip;
   at least one air barrier provided in the gap between the LED chip and the PCB; and
   at least one void formed by air entering from inside the gap, wherein the at least one void is formed in the optical dome and is spaced apart from the LED chip.

2. The display apparatus of claim 1, further comprising a solder paste provided between the LED chip and the PCB to mount the LED chip on the PCB,
   wherein the at least one air barrier is formed by reflowing the solder paste.

3. The display apparatus of claim 1, wherein the at least one air barrier is configured to prevent or delay air between the LED chip and the PCB from being discharged into the optical dome.

4. The display apparatus of claim 1, further comprising a solder paste provided on the PCB, wherein the solder paste comprises solder powder and a flux.

5. The display apparatus of claim 4, wherein the at least one air barrier comprises the flux.

6. The display apparatus of claim 1, wherein the LED chip comprises a first electrode pad and a second electrode pad arranged in parallel with each other in a first direction, and the at least one air barrier extends in the first direction.

7. The display apparatus of claim 6, wherein the at least one air barrier comprises a first air barrier and a second air barrier spaced apart from each other in a second direction perpendicular to the first direction.

8. The display apparatus of claim 7, wherein the at least one void is spaced apart from the LED chip in the second direction.

9. The display apparatus of claim 7, wherein the at least one void is formed on the first air barrier or the second air barrier.

10. The display apparatus of claim 7, wherein the at least one void comprises a plurality of voids, and each of the plurality of voids is formed on the first air barrier or the second air barrier.

11. The display apparatus of claim 7, wherein the at least one void comprises a plurality of voids, and the plurality of voids are formed on the first air barrier or the second air barrier.

12. The display apparatus of claim 1, wherein the LED chip is mounted on a mounting surface of the PCB by a chip on board (COB) method.

13. The display apparatus of claim 1, wherein the LED chip comprises a lateral side and a longitudinal side, wherein a length of the longitudinal side is less than or equal to 500 µm.

14. The display apparatus of claim 1, wherein the LED chip comprises:
   an n-type semiconductor layer,
   a p-type semiconductor layer,
   a light emission layer provided between the n-type semiconductor layer and the p-type semiconductor layer, the light emission layer configured to emit light, and
   a growth substrate covering an upper surface of the n-type semiconductor layer or the p-type semiconductor layer.

15. The display apparatus of claim 14, wherein the LED chip further comprises a distributed Bragg reflector (DBR) layer provided on an upper surface of the growth substrate.

16. A display apparatus comprising:
   a printed circuit board (PCB);
   a light emitting diode (LED) chip provided on the PCB and configured to output light;
   an optical dome provided on the PCB and covering the LED chip;
   at least one void formed by air entering from inside the optical dome and between the LED chip and the PCB;
   at least one air barrier provided between the LED chip and the PCB such that the at least one void is spaced apart from the LED chip,
   a solder paste provided on the PCB and comprising a solder powder and a flux,
   wherein the at least one void is formed in the optical dome, and
   wherein the at least one air barrier comprises the flux.

* * * * *